(12) United States Patent
Xie et al.

(10) Patent No.: US 12,432,997 B2
(45) Date of Patent: Sep. 30, 2025

(54) METHOD FOR FORMING AN EPITAXIAL LAYER WITH BETTER QUALITY

(71) Applicant: United Semiconductor (Xiamen) Co., Ltd., Fujian (CN)

(72) Inventors: Yong Xie, Shamen (CN); Qiang Gao, Shamen (CN); Shih-Hsien Huang, Kaohsiung (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 452 days.

(21) Appl. No.: 17/889,390

(22) Filed: Aug. 16, 2022

(65) Prior Publication Data

US 2024/0030295 A1   Jan. 25, 2024

(30) Foreign Application Priority Data

Jul. 20, 2022 (CN) .......................... 202210857932.2

(51) Int. Cl.
*H10D 64/01* (2025.01)
*H10D 64/62* (2025.01)

(52) U.S. Cl.
CPC ............. *H10D 64/01* (2025.01); *H10D 64/62* (2025.01)

(58) Field of Classification Search
CPC ... H01L 29/401; H01L 29/45; H01L 29/0847; H01L 29/161; H01L 29/66628; H01L 29/66636; H01L 29/7848; H01L 29/456; H01L 29/165; H01L 29/41725
See application file for complete search history.

(56) References Cited

U.S. PATENT DOCUMENTS

| | | | |
|---|---|---|---|
| 2009/0134381 A1* | 5/2009 | Shimamune | H01L 29/4975 257/19 |
| 2013/0122674 A1* | 5/2013 | Lin | H01L 29/165 438/285 |
| 2013/0161751 A1* | 6/2013 | Chung | H01L 29/66636 257/E27.06 |
| 2015/0021688 A1* | 1/2015 | Sung | H01L 29/7834 438/300 |
| 2015/0048417 A1* | 2/2015 | Kwok | H01L 29/7847 257/190 |
| 2016/0172361 A1* | 6/2016 | Rhee | H01L 29/7848 257/369 |
| 2016/0276481 A1* | 9/2016 | Wu | H01L 21/3065 |
| 2017/0117410 A1* | 4/2017 | Hu | H10D 62/151 |
| 2022/0181488 A1* | 6/2022 | Liang | H01L 29/7848 |

OTHER PUBLICATIONS

Hartmann, J. M., et al., "Selective epitaxial growth of boron- and phosphorus-doped Si and SiGe for raised sources and drains", Journal of Crystal Growth 264, pp. 36-47 (Year: 2004).*

* cited by examiner

*Primary Examiner* — Fernando L Toledo
*Assistant Examiner* — Ryan T. Fortin
(74) *Attorney, Agent, or Firm* — Winston Hsu

(57) ABSTRACT

A semiconductor manufacturing method includes providing a substrate, forming a silicon germanium epitaxial layer in the substrate, forming a first silicon layer on the silicon germanium epitaxial layer, wherein the first silicon layer is a pure silicon layer, and forming a second silicon layer on the first silicon layer, wherein the second silicon layer comprises a silicon layer doped with boron atoms, wherein the boron-doped silicon layer does not comprise germanium.

13 Claims, 4 Drawing Sheets

METHOD FOR FORMING AN EPITAXIAL LAYER WITH BETTER QUALITY

BACKGROUND OF THE INVENTION

1. Field of the Invention

The invention relates to the field of semiconductor manufacturing, in particular to a method for forming an epitaxial layer with better quality.

2. Description of the Prior Art

Epitaxial technology is often used in semiconductor manufacturing. At present, epitaxial layers are often used to replace doped regions as source/drain regions of transistors. Epitaxial layers can provide stress and enhance the carrier mobility of transistors, which means that the performance of semiconductor devices can be further improved.

Although the epitaxial layer has the advantage of improving the mobility of carriers, the formation of the epitaxial layer will also produce corresponding disadvantages in some cases. For example, if the epitaxial layer is made of silicon germanium (SiGe), when the concentration of germanium atoms in the silicon germanium epitaxial layer is high, the germanium atoms are more likely to migrate and agglomerate, which is more obvious at high temperature. As a result, the surface of the epitaxial layer made of SiGe may be uneven. On the other hand, when the contact structure is formed on the epitaxial layer in the subsequent process, atoms (such as nickel atoms) carried by the contact structure may also migrate into the underlying epitaxial layer in the high-temperature process. All the above phenomena may affect the yield of semiconductor devices.

SUMMARY OF THE INVENTION

The invention provides a semiconductor manufacturing method, which comprises providing a substrate, forming a silicon germanium epitaxial layer in the substrate, forming a first silicon layer on the silicon germanium epitaxial layer, wherein the first silicon layer is a pure silicon layer, and forming a second silicon layer on the first silicon layer, wherein the second silicon layer comprises a silicon layer doped with boron atoms.

The invention is characterized in that a pure silicon layer is formed on the silicon germanium epitaxial layer, the pure silicon layer can avoid the agglomeration and migration of the germanium atoms in the silicon germanium epitaxial layer, and can also achieve the effect of protecting the silicon germanium epitaxial layer, prevent other atoms (such as boron atoms or nickel atoms) from migrating to the silicon germanium epitaxial layer in a high-temperature process, and reduce the surface unevenness of the silicon germanium epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
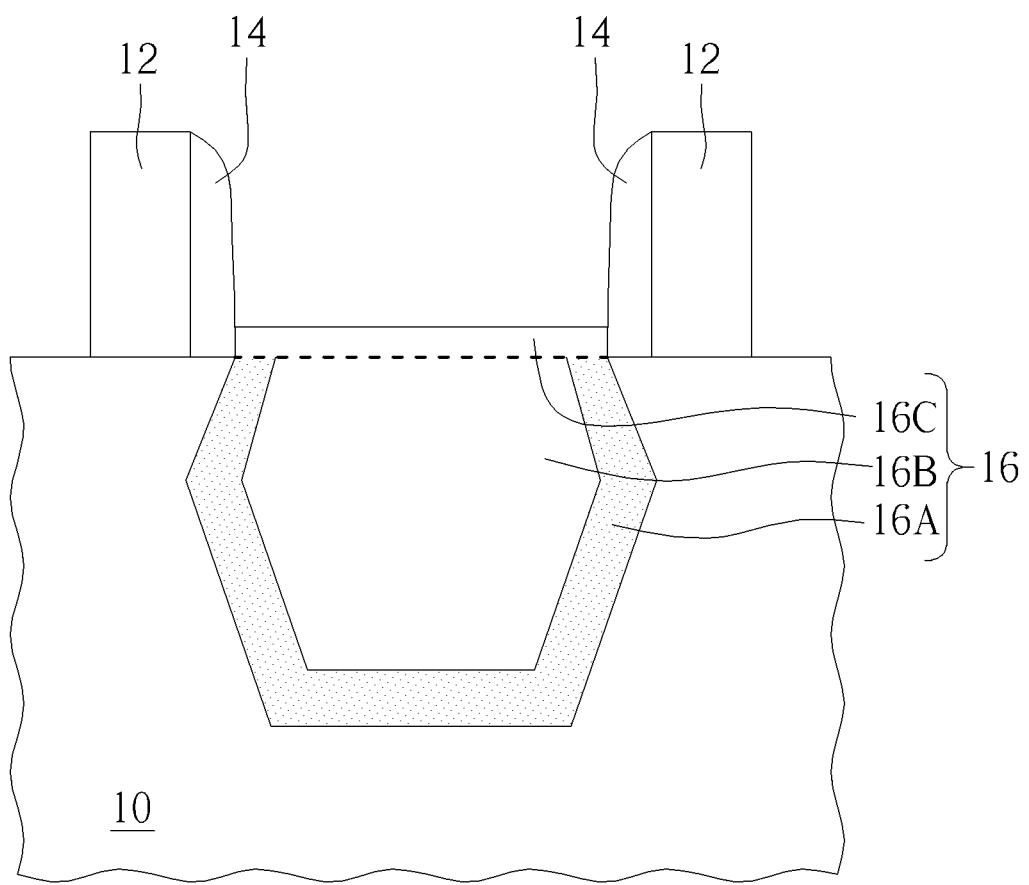
FIG. 1 to FIG. 4 show schematic cross-sectional structures of the semiconductor structure of the present invention.

Please refer to FIG. 1 to FIG. 4, which show the schematic cross-sectional structure of the semiconductor structure of the present invention. First, as shown in FIG. 1, a substrate 10 is provided, and at least one gate structure 12 is formed on the substrate 10, the spacers 14 can be formed beside the gate structure 12, and a silicon germanium epitaxial layer 16 is formed in the substrate 10 next to the gate structure 12. The gate structure 12 may comprise a polysilicon gate or a metal gate, and the spacer 14 comprises an insulating material such as silicon oxide, silicon nitride or silicon oxynitride, but it is not limited to this. The gate structure 12 is used as the gate of a transistor structure, and the silicon germanium epitaxial layer 16 is used as the source/drain of the transistor. The silicon epitaxial layer 16 is formed by an epitaxial method. In addition, in this embodiment, the silicon germanium epitaxial layer 16 may be formed by a plurality of different silicon germanium epitaxial layers, such as a buffer layer 16A, a bulk layer 16B and a protective layer 16C, the buffer layer 16A, the bulk layer 16B and the protective layer 16C are all made of silicon germanium materials and are all formed by epitaxial methods, and the difference among them is that their silicon germanium concentration ratios are different. For example, the weight percentage concentration of germanium in the buffer layer 16A is about 10% to 35%, but it is not limited to this. In the bulk layer 16B, the weight percentage concentration of germanium is about 20% to 40%, but it is not limited to this. In the protective layer 16C, the weight percentage concentration of germanium is about 40% or more, and the higher the protective layer 16C is, the lower the concentration of germanium is, but it is not limited to this. It should be noted that although the epitaxial silicon germanium layer 16 includes three epitaxial layers (namely, the buffer layer 16A, the bulk layer 16B, and the protective layer 16C) in this embodiment, but in other embodiments of the present invention, the epitaxial silicon germanium layer 16 may be a single silicon germanium layer, be composed of two silicon germanium layers, or be composed of more silicon germanium layers, instead of three silicon germanium layers. As for the method of forming the silicon germanium epitaxial layer, it is formed by the epitaxial method, which is a conventional technology in the field, so it will not be described here.

When the weight percentage concentration of germanium atoms in the silicon germanium epitaxial layer 16 is high, for example, more than 40%, it means that there are a large number of germanium atoms in the silicon germanium epitaxial layer 16, and the phenomenon of germanium atom migration is easy to occur. In the prior art, if a capping layer (not shown) and a contact structure are directly formed on the silicon germanium epitaxial layer 16, the applicant found that it is easy to cause germanium atoms to migrate and agglomerate, and the atoms contained in the capping layer and the contact structure may also affect the silicon germanium epitaxial layer below, which will result in the degradation of the quality of semiconductor devices.

Figure 2:
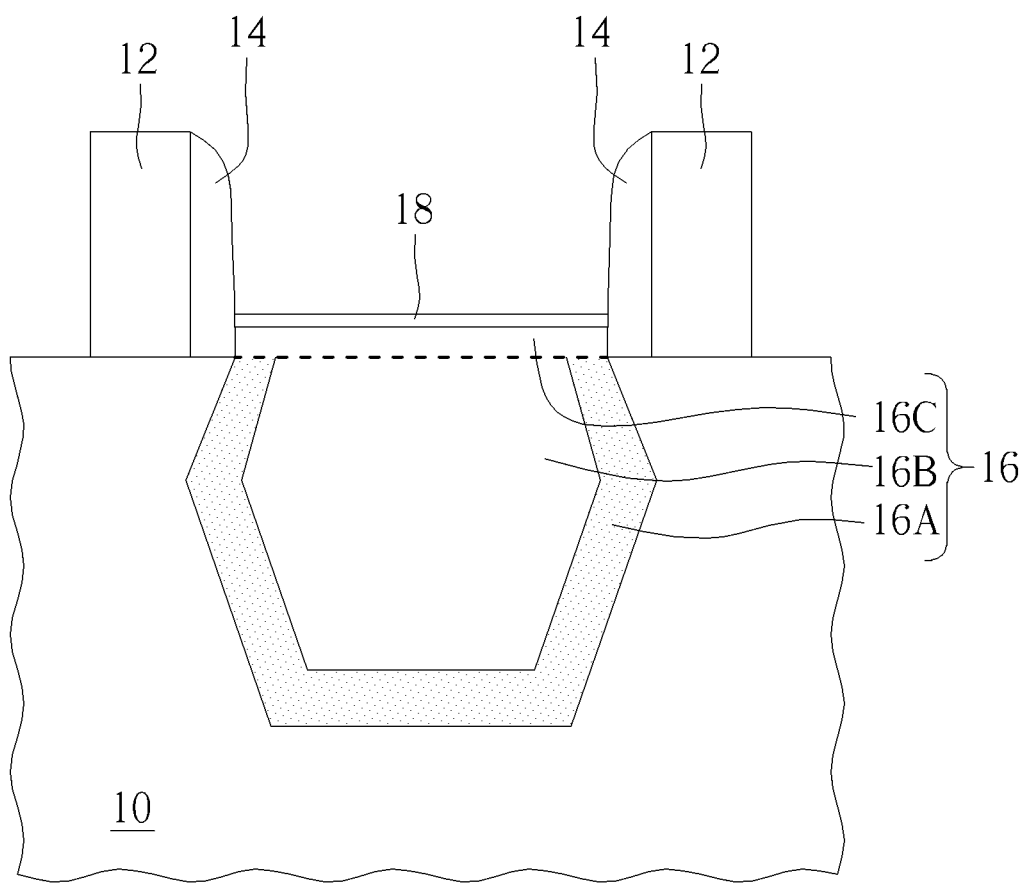

Therefore, in order to solve the above problems, in the present invention, after the silicon germanium epitaxial layer 16 is formed, as shown in FIG. 2, a pure silicon epitaxial layer 18 is additionally formed on the surface of the silicon germanium epitaxial layer 16. In this embodiment, the pure silicon epitaxial layer 18 is made of pure silicon with a thickness of about 5-30 angstroms, and the process temperature is controlled at about 600-700° C. The gas introduced in the process includes hydrogen and dichlorosilane (abbreviated as DCS, $H_2SiCl_2$). According to the experimental results, when the above conditions are met, the pure silicon epitaxial layer 18 has good quality, which is helpful to achieve the effect of blocking atomic migration and planarization in the subsequent process. However, the above process parameters are only examples of this embodiment, and the present invention is not limited thereto. It should be noted that the above-mentioned process temperature is controlled at about 600-700 degrees Celsius, which is lower than the temperature used in the subsequent fabrication of other devices (such as the subsequently formed protective layer). Therefore, under this temperature range, a pure silicon epitaxial layer 18 is formed to cover the silicon germanium epitaxial layer 16. In other words, in a relatively low temperature environment, the migration and agglomeration of germanium atoms are less active, and the pure silicon epitaxial layer 18 is formed to cover the silicon germanium epitaxial layer 16, which can achieve the effect of blocking the migration of germanium atoms.

Figure 3:
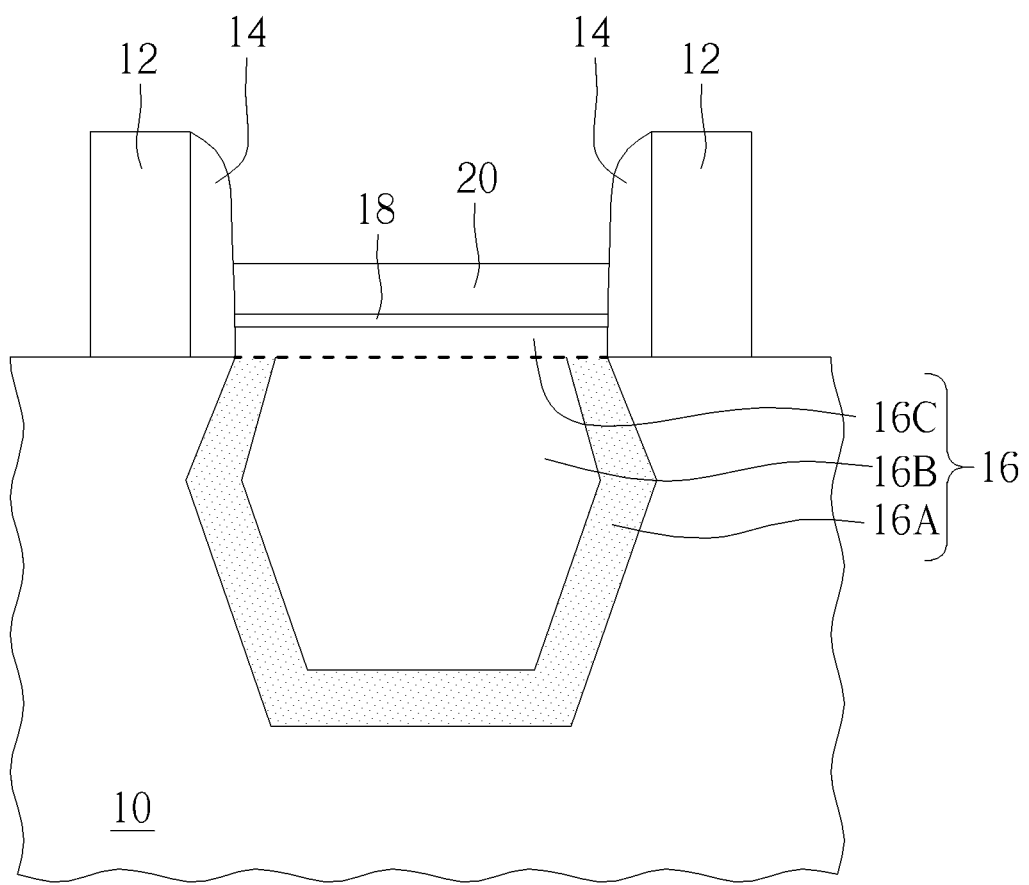

Then, as shown in FIG. 3, a boron-containing epitaxial layer 20 is formed on the pure silicon epitaxial layer 18. In this embodiment, boron atoms are doped in the boron-containing epitaxial layer 20, the concentration of boron atoms is about 1E20 cm-3 to 1E22 cm-3, the thickness of the boron-containing epitaxial layer 20 is about 50 angstroms to 200 angstroms, and the process temperature is about 700 to 800 degrees Celsius. The gas introduced into the process includes hydrogen, dichlorosilane, hydrogen chloride (HCl) gas and diborane ($B_2H_6$) gas, etc. However, the above process parameters are only examples of this embodiment, and the present invention is not limited thereto. It is worth noting that the boron-containing epitaxial layer 20 can serve as a buffer between the epitaxial layer and the subsequent contact structure, and the boron-containing epitaxial layer 20 is easy to cause the migration of germanium atoms due to the high processing temperature. However, in this embodiment, since the pure silicon epitaxial layer 18 has been formed first, the germanium atoms will be blocked by the pure silicon epitaxial layer 18 during the migration, and will not migrate into the boron-containing epitaxial layer 20, so it is not easy to cause uneven surface of boron-containing epitaxial layer 20. Another advantage of the present invention is that the process gas for forming the boron-containing epitaxial layer 20 contains hydrogen chloride, in which the applicant found that the hydrogen chloride gas may damage the underlying silicon germanium epitaxial layer 16, but since the pure silicon epitaxial layer 18 has been formed to cover the silicon germanium epitaxial layer 16, the effect of protecting the silicon germanium epitaxial layer 16 from being damaged by the hydrogen chloride gas can also be achieved. In addition, except for the germanium atoms migrating at high temperature, the boron atoms of the boron-containing epitaxial layer 20 are also easy to migrate, so the pure silicon epitaxial layer 18 can also prevent the boron atoms from migrating to the lower silicon germanium epitaxial layer 16.

Figure 4:
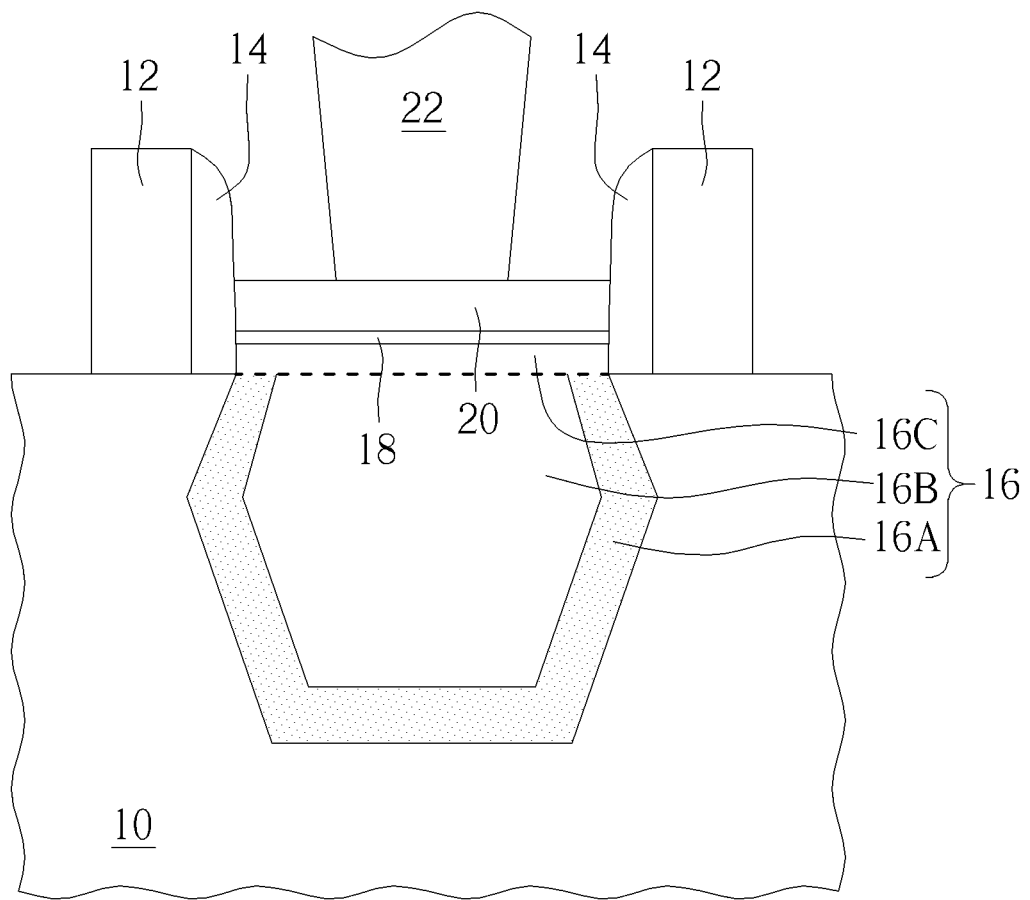

Next, as shown in FIG. 4, a contact structure 22 is formed on the boron-containing epitaxial layer 20, the contact structure 22 contains conductive metals such as tungsten and nickel. It should be noted that in some cases, if the contact structure 22 contains nickel, nickel will easily react with germanium to produce NiSiGe compound, which is not conducive to the conductivity of the contact structure. Therefore, in this embodiment, since the pure silicon epitaxial layer 18 has been formed first, the germanium atoms will be blocked by the pure silicon epitaxial layer 18 and will not migrate into the boron-containing epitaxial layer 20, thus greatly avoiding the generation of nickel silicon germanium (NiSiGe) compounds.

According to the above description and drawings, the present invention provides a semiconductor manufacturing method, which comprises: providing a substrate 10, forming a silicon germanium epitaxial layer 16 in the substrate 10, forming a first silicon layer (i.e., the pure silicon epitaxial layer 18) on the silicon germanium epitaxial layer 16, wherein the first silicon layer is a pure silicon layer, and forming a second silicon layer (i.e., the boron-containing epitaxial layer 20) on the first silicon layer, wherein the second silicon layer comprises a silicon layer doped with boron atoms.

In some embodiments of the present invention, the silicon germanium epitaxial layer 16, the first silicon layer (the pure silicon epitaxial layer 18) and the second silicon layer (the boron-containing epitaxial layer 20) are formed by a same machine, and the silicon germanium epitaxial layer 16, the first silicon layer (the pure silicon epitaxial layer 18) and the second silicon layer (the boron-containing epitaxial layer 20) are formed by epitaxial method.

In some embodiments of the present invention, a formation temperature of the first silicon layer (the pure silicon epitaxial layer 18) is between 600 degrees Celsius and 700 degrees Celsius.

In some embodiments of the present invention, a formation temperature of the second silicon layer (the boron-containing epitaxial layer 20) is between 700 degrees Celsius and 800 degrees Celsius.

In some embodiments of the present invention, the concentration of boron atoms in the second silicon layer (the boron-containing epitaxial layer 20) is between 1E20 cm-3 and 1E22 cm-3.

In some embodiments of the present invention, the concentration of germanium atoms in the silicon germanium epitaxial layer 16 varies along a vertical direction, and the average weight percentage concentration of germanium atoms in the silicon germanium epitaxial layer 16 is higher than 40%.

In some embodiments of the present invention, the silicon germanium epitaxial layer 16 comprises an upper part and a lower part, wherein the germanium concentration of the upper part is greater than the germanium concentration of the lower part.

In some embodiments of the present invention, when the first silicon layer (the pure silicon epitaxial layer 18) is formed, the gas introduced into a machine includes hydrogen and dichlorosilane.

In some embodiments of the present invention, when the second silicon layer (the boron-containing epitaxial layer 20) is formed, the gas introduced into a machine includes hydrogen, dichlorosilane, diborane and hydrogen chloride.

In some embodiments of the present invention, the thickness of the first silicon layer (the pure silicon epitaxial layer 18) is between 5 and 30 angstroms.

In some embodiments of the present invention, the thickness of the second silicon layer (the boron-containing epitaxial layer 20) is between 50 and 200 angstroms.

In some embodiments of the present invention, a gate structure 12 is located on the substrate 10, and the silicon germanium epitaxial layer 16 is located next to the gate structure 12.

In some embodiments of the present invention, a contact structure 22 is formed on the second silicon layer (the boron-containing epitaxial layer 20) and electrically connected to the second silicon layer (the boron-containing epitaxial layer 20).

In some embodiments of the present invention, both the first silicon layer (the pure silicon epitaxial layer 18) and the second silicon layer (the boron-containing epitaxial layer 20) each have a flat top surface.

The invention is characterized in that a pure silicon layer is formed on the silicon germanium epitaxial layer, wherein the pure silicon layer can avoid the agglomeration and migration of germanium atoms in the silicon germanium epitaxial layer, and can also achieve the effect of protecting the silicon germanium epitaxial layer, prevent other atoms (such as boron atoms or nickel atoms) from migrating to the silicon germanium epitaxial layer in a high-temperature process, and reduce the surface unevenness of the silicon germanium epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor manufacturing method, comprising:
   providing a substrate, and forming a silicon germanium epitaxial layer in the substrate;
   forming a first silicon layer on the silicon germanium epitaxial layer, wherein the first silicon layer is a pure silicon layer, wherein the thickness of the first silicon layer is between 5 and 30 angstroms; and
   forming a second silicon layer on the first silicon layer, wherein the second silicon layer comprises a silicon layer doped with boron atoms, wherein the second silicon layer does not comprise germanium.

2. The semiconductor manufacturing method according to claim 1, wherein the silicon germanium epitaxial layer, the first silicon layer and the second silicon layer are formed by a same machine, and the silicon germanium epitaxial layer, the first silicon layer and the second silicon layer are formed by an epitaxial method.

3. The semiconductor manufacturing method according to claim 1, wherein a formation temperature of the first silicon layer is between 600° C. and 700° C.

4. The semiconductor manufacturing method according to claim 1, wherein a formation temperature of the second silicon layer is between 700° C. and 800° C.

5. The semiconductor manufacturing method according to claim 1, wherein the concentration of boron atoms in the second silicon layer is between 1E20 cm-3 and 1E22 cm-3.

6. The semiconductor manufacturing method according to claim 1, wherein the concentration of germanium atoms in the silicon germanium epitaxial layer varies along a vertical direction, and the average weight percentage concentration of the germanium atoms in the silicon germanium epitaxial layer is higher than 40%.

7. The semiconductor manufacturing method according to claim 6, wherein the silicon germanium epitaxial layer comprises an upper part and a lower part, wherein the germanium concentration of the upper part is greater than the germanium concentration of the lower part.

8. The semiconductor manufacturing method according to claim 1, wherein when the first silicon layer is formed, a gas introduced into a machine contains hydrogen and dichlorosilane.

9. The semiconductor manufacturing method according to claim 1, wherein when the second silicon layer is formed, a gas introduced into a machine includes hydrogen, dichlorosilane, diborane and hydrogen chloride.

10. The semiconductor manufacturing method according to claim 1, wherein the thickness of the second silicon layer is between 50 and 200 angstroms.

11. The semiconductor manufacturing method according to claim 1, further comprising forming a gate structure on the substrate, and the silicon germanium epitaxial layer is disposed beside the gate structure.

12. The semiconductor manufacturing method according to claim 1, further comprising forming a contact structure on the second silicon layer and electrically connecting to the second silicon layer.

13. The semiconductor manufacturing method according to claim 1, wherein both the first silicon layer and the second silicon layer have a flat top surface.

* * * * *